US008850367B2

(12) United States Patent
Lai et al.

(10) Patent No.: US 8,850,367 B2
(45) Date of Patent: Sep. 30, 2014

(54) METHOD OF DECOMPOSABLE CHECKING APPROACH FOR MASK ALIGNMENT IN MULTIPLE PATTERNING

(71) Applicant: Taiwan Semiconductor Manufacturing Company, Ltd., Hsin-Chu (TW)

(72) Inventors: Chih-Ming Lai, Hsinchu (TW);
Ken-Hsien Hsieh, Taipei (TW);
Wen-Chun Huang, Tainan (TW);
Ru-Gun Liu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/732,855

(22) Filed: Jan. 2, 2013

(65) Prior Publication Data
US 2014/0189611 A1 Jul. 3, 2014

(51) Int. Cl.
*G06F 17/50* (2006.01)
(52) U.S. Cl.
CPC ..................................... *G06F 17/50* (2013.01)
USPC ............... 716/54; 716/55; 716/110; 716/111; 716/119
(58) Field of Classification Search
USPC ............................................. 716/54
See application file for complete search history.

(56) References Cited

U.S. PATENT DOCUMENTS

2011/0004858 A1* 1/2011 Chang et al. ................. 716/122
2011/0296360 A1* 12/2011 Wang et al. ................... 716/106

* cited by examiner

*Primary Examiner* — Vuthe Siek
*Assistant Examiner* — Eric Lee
(74) *Attorney, Agent, or Firm* — Haynes and Boone, LLP

(57) ABSTRACT

The present disclosure provides one embodiment of an integrated circuit (IC) design method. The method includes receiving an IC design layout having a first plurality of features defined in a first layer and a second plurality of features defined in a second layer; converting the IC design layout to a topological diagram having nodes, chains and arrows; and identifying alignment conflict based on the topological diagram using rules associated with loop and path count.

20 Claims, 13 Drawing Sheets

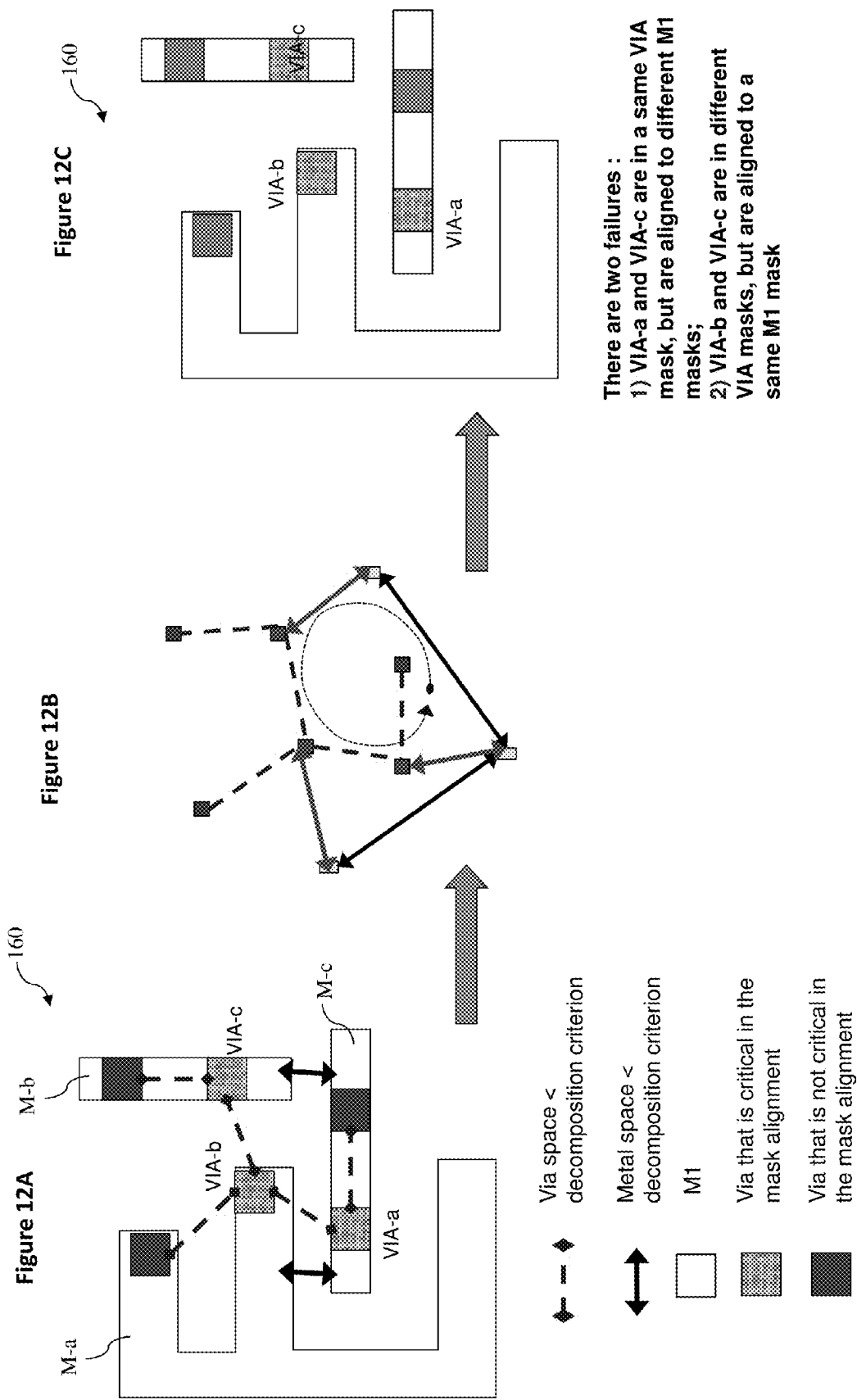

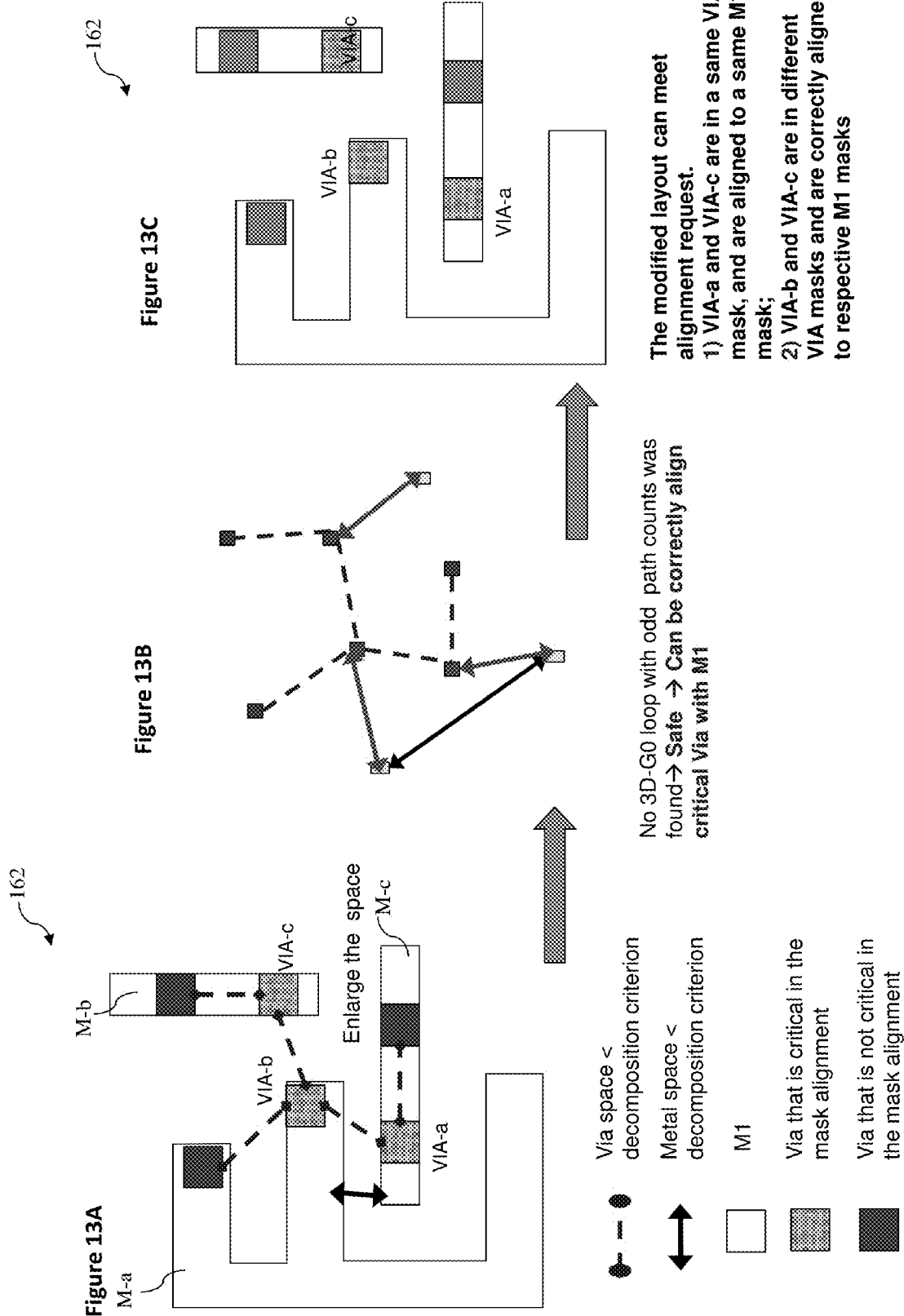

US 8,850,367 B2

METHOD OF DECOMPOSABLE CHECKING APPROACH FOR MASK ALIGNMENT IN MULTIPLE PATTERNING

BACKGROUND

Semiconductor technologies are continually progressing to smaller feature sizes, for example down to feature sizes of 28 nanometers, 20 nanometers, and below. A patterned photoresist (PR) layer used to produce such small feature sizes typically has a high aspect ratio. Maintaining a desired critical dimension (CD) can be very difficult for various reasons, including incapability of shrinking the minimum area and degraded trench end resolution. Multiple patterning is used to enhance the lithography patterning resolution. However, the mask alignments associated with multiple patterning has various difficulties that include mask alignment conflicts, especially between different layers.

Therefore, what is needed is a method and a system to provide effective IC design and fabrication for the advanced IC technologies addressing the above issues.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

FIGS. 12A, 12B and 12C illustrate one example of an IC method for checking mask alignment conflict in an IC design layout.

FIGS. 13A, 13B and 13C illustrate one example of an IC method for modifying an IC design layout and checking mask alignment conflict in the IC design layout.

DETAILED DESCRIPTION

Figure 1:
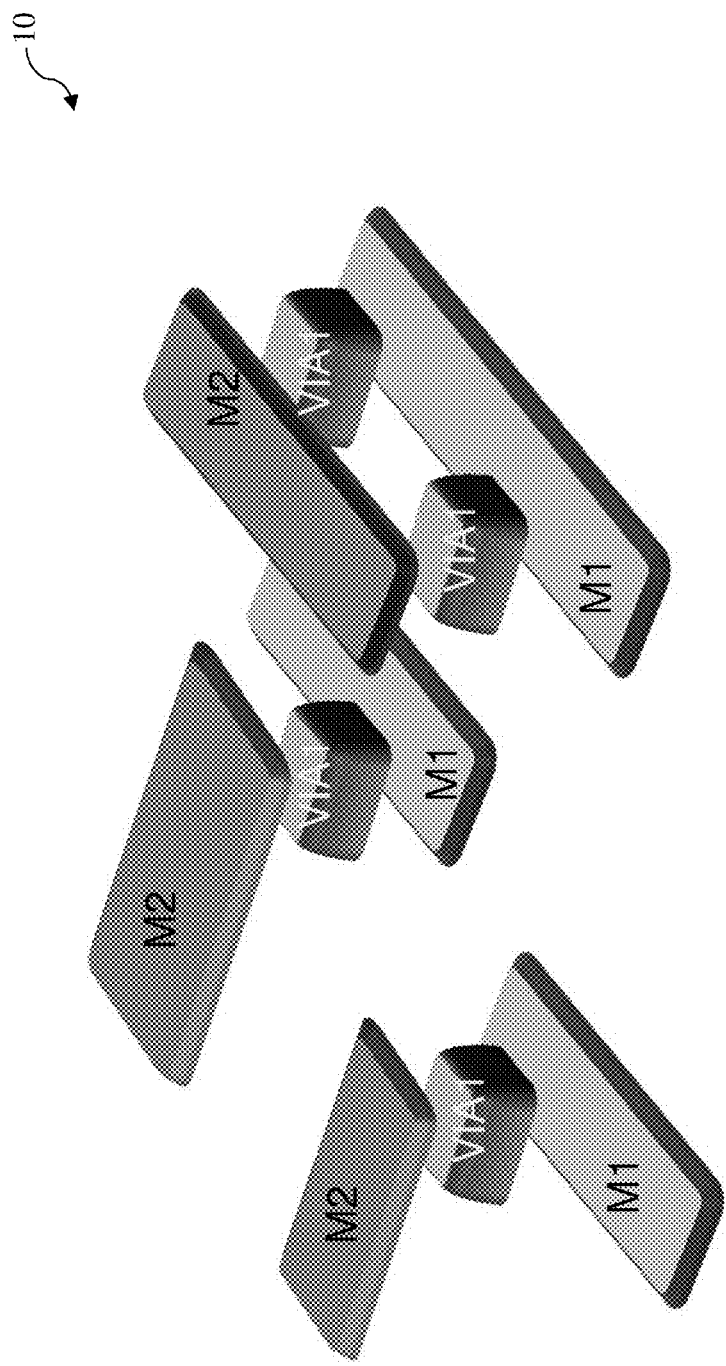
FIGS. 1 and 2 are perspective views of a semiconductor structure in various embodiments.

It is understood that the following disclosure provides many different embodiments, or examples, for implementing different features of the invention. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relation between the various embodiments and/or configurations discussed.

A method of decomposable checking approach for mask alignment in multiple patterning and a system to implement the same are described with reference to FIGS. 1 through 13 according one or more embodiments. A double patterning process is used as one example for illustration. However, the method can be applied to the mask design and alignment for a multiple patterning process.

FIG. 1 is a perspective view of one embodiment of a semiconductor structure 10 formed on a substrate such as a semiconductor wafer. The semiconductor structure 10 includes an interconnect structure having metal lines, contacts and vias distributed in multiple layers. In the present example for illustration, the semiconductor structure 10 includes a first metal layer (metal 1 or M1), a second metal layer (metal 2 or M2) and a via layer (VIA1) between M1 and M2. Each layer includes a pattern (or layout) having plurality of features designed and configured according to the integrated circuit to be formed. For example, the M1 layer includes multiple metal lines (labeled as M1), the M2 layer includes multiple metal lines (labeled as M2), and the via layer includes multiple vias (labeled as VIA1).

If all M2 features are defined in one photomask (mask or reticle); all VIA1 features are defined in one mask; and all M1 features are defined in one mask, the manufacturing alignment procedure among M1 to VIA1 and to M2 is straightly forward by single mask to single mask alignment. The mask alignment flow is VIA1 is aligned to M1 and M2 is aligned to VIA1. Simply presented, the mask assignment flow is M2 to VIA1 to M12>M22>VIA12>M1.

Figure 2:
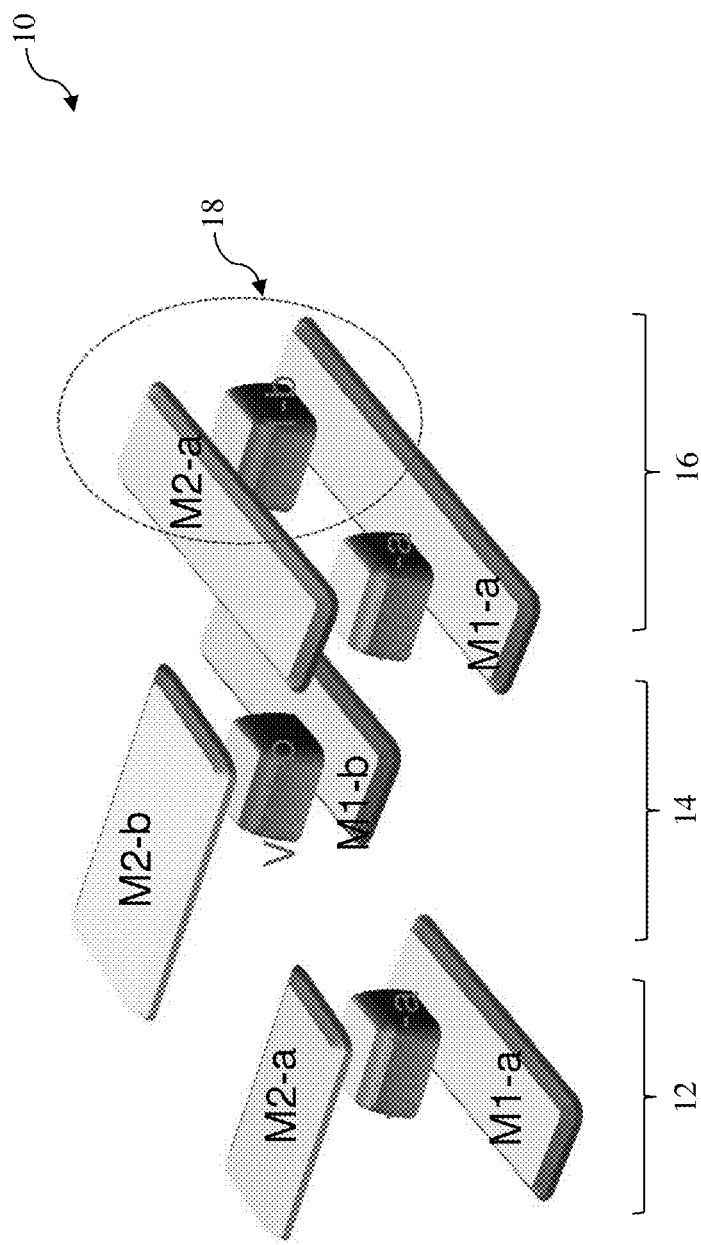

FIG. 2 is similar to FIG. 1 and includes the semiconductor structure 10 in a perspective view. However, a different mask strategy is utilized. When the design dimension was shrunk and the feature size gets smaller, a double pattern technology is used to enhance the resolution. For example, a pattern defined in one mask is decomposed to two patterns that are defined in two masks. In other words, a single layer layout is decomposed into two masks for patterning the corresponding material layer on a wafer. For example, the features in M1 layout will be decomposed into two subsets with a first subset assigned to a first mask (M1-*a* mask) and a second subset assigned to a second mask (M1-*b* mask). Accordingly, the features in the first subset are labeled as "M1-*a*" and the features in the second subset are labeled as "M1-*b*" in FIG. 2. Similarly, the features in VIA1 layout will be decomposed into two subsets with a first subset assigned to a first mask (VIA1-*a* mask) and a second subset assigned to a second mask (VIA1-*b* mask). Accordingly, the features in the first subset are labeled as "VIA1-*a*" and the features in the second subset are labeled as "VIA1-*b*". The features in M2 layout will be decomposed into two subsets with a first subset assigned to a first mask (M2-*a* mask) and a second subset assigned to a second mask (M2-*b* mask). Accordingly, the features in the first subset are labeled as "M2-*a*" and the features in the second subset are labeled as "M2-*b*".

Considering alignment during lithography processes to transfer those patterns defined in different masks, the mask alignment flow is not as simply as M2 to VIA1 to M1 in the situation presented in FIG. 1. Since each layer layout is defined in two masks, the mask alignment flow is not easy. In one example illustrated in FIG. 2, the mask alignment flow is M2-*a* to VIA1-*a* to M1-*a* (such as the stack 12) and M2-*b* to VIA1-b to M1-*b* (such as stack 14). However, for the stack 16, a portion 18 of the stack 16 will go through an incorrect mask alignment flow as M2-*a* to VIA1-*b* to M1-*a*. This non-controllable M2-*a* to VIA1-*b* to M1-*a* will result in improper mask alignment and may impact the manufacturing yield.

The existing method (rule/algorithm) may split M1 pattern into M1-*a* and M1-*b* masks, or VIA1 pattern into VIA1-*a* and VIA1-*b* masks, but cannot properly align the masks between these layers to avoid those alignment conflicts. The disclosed mask alignment method is able to address the alignment conflict issues. In one embodiment, the mask alignment method is presented in a design rule document or is programmed in a design rule check (DRC) utility. For example, the method is incorporated in a design for manufacturing (DFM) module in a design tool.

The mask alignment method is applicable to situations where multiple layers are patterned by double patterning technologies or multiple patterning technologies. More particularly, a first layer design layout (referred to as "A") is decomposed into two masks for manufacturing. Associated with this layer is another layer, such as its overlying layer ("U"), or underlying layer ("D"). There is a layout alignment requirement that a first subset of features of layer "A" defined in one mask is to be aligned with a second subset of features of the "U" layer (or "D" layer), those features in the second subset are required to be assigned in a same mask for layer "U" (or layer "D").

The disclosed mask alignment method is able to optimize layer to layer alignment condition between decomposed masks in double patterning technologies. The mask alignment method is described in details below.

Figure 3:
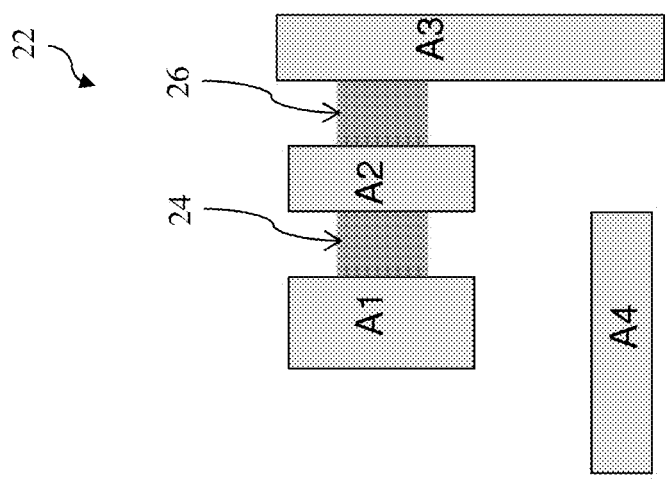
FIG. 3 illustrates top views of an integrated circuit (IC) design layout constructed according to one or more embodiment.
Figure 3:
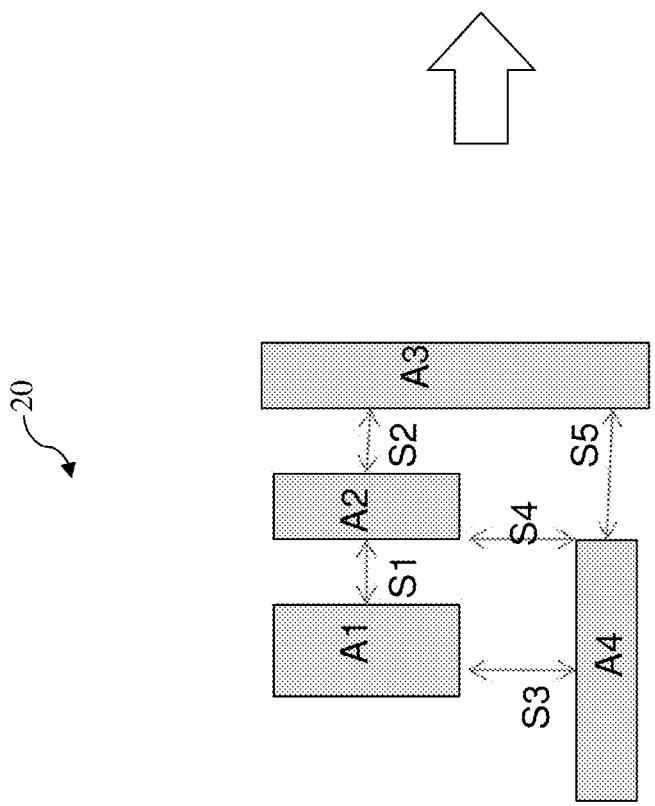

FIG. 3 is a top view of an integrated circuit (IC) pattern (or design layout) 20 having various features to be formed in a same layer "A" of a semiconductor substrate. In the present example for illustration, the pattern 20 includes exemplary features A1, A2, A3, and A4. The features A1~A4 are polygons in the same layer "A" and various distances between adjacent features are labeled as S1, S2, S3, S4 and S5, respectively, in FIG. 3. For example, S1 represents a distance between the features A1 and A2; S2 represents a distance between the features A2 and A3; and so on.

There is a dimensional parameter "S0" associated with manufacturing capability, where S0 is also referred to as decomposition criterion. If a distance between two adjacent features is less than the decomposition criterion S0, then those two adjacent features are to be assigned to different masks. For example, if the distance S1 is smaller than S0, then A1 and A2 have to be decomposed to different masks. In this case, a (graphic) decomposing marker is defined between A1 and A2 to denote the relation that A1 and A2 are required to be decomposed into different masks. A decomposing marker is a virtual feature in the pattern to present a relational constrain added to the pattern, or adjacent features in the pattern. By adding additional decomposing marks, the pattern 20 is converted to a pattern 22. In the present example shown in FIG. 3, two decomposing markers 24 and 26 are present in the pattern 22. The first decomposing marker 24 means that A1 and A2 have to be decomposed to different masks. The second decomposing marker 26 means that A2 and A2 have to be decomposed to different masks. Collectively, the feature A2 must be in a different mask from A1 and A3 while A1 and A3 may be in a same mask since there is no decomposing marker linked between A1 and A3 directly.

Figure 4:
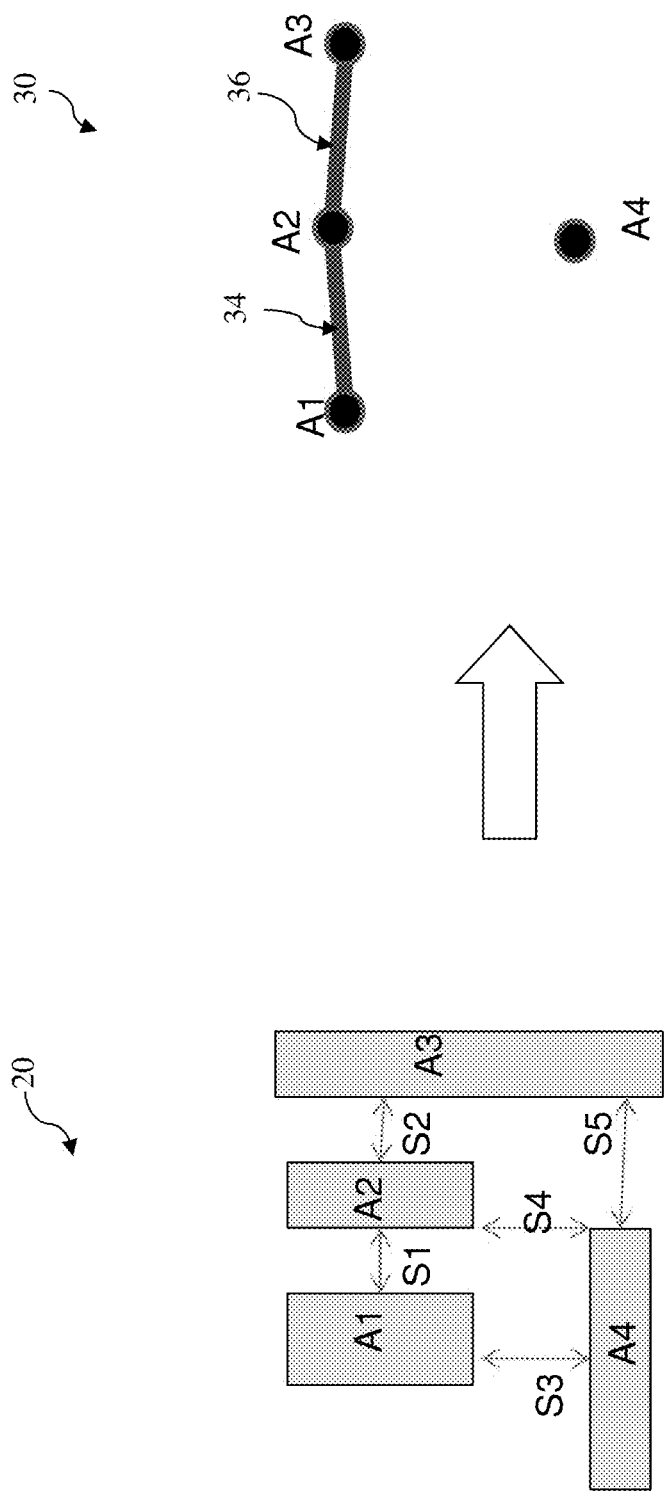
FIG. 4 illustrates a top view of an IC design layout and a topological diagram constructed according to one embodiment.

FIG. 4 is a top view of the integrated circuit (IC) pattern (or design layout) 20 having various features to be formed in the same layer (layer "A"). The pattern 20 is converted into a topologic diagram (or 3D-net) 30 to simplify an interlayer geometry relation for alignment conflict check. Two terms "node" and "chain" are introduced and defined here. A feature (or a polygon) in the pattern 20 is converted into a node that is represented by a dot in the 3D-net 30. Similar labels are used in the 3D-net 30. For example, the feature A1 in the pattern 20 is converted to a node A1 in the 3D-net 30; the feature A2 in the pattern 20 is converted to a node A2 in the 3D-net 30; the feature A3 in the pattern 20 is converted to a node A3 in the 3D-net 30; and the feature A4 in the pattern 20 is converted to a node A4 in the 3D-net 30.

A decomposing marker in the pattern 20 is represented by a chain linking the corresponding nodes in the 3D-net 30. For example, the first decomposing marker 24 in FIG. 2 is represented by the chain 34 that links the nodes A1 and A2 and the second decomposing marker 26 is represented by the chain 36 that links the nodes A2 and A3. If there is a chain between two nodes, it means that the two features have to be decomposed into different mask. Furthermore, when the space between two features in the pattern 20 is less than the dimensional criterion, a "chain" is added to connect the corresponding two nodes in the 3D-net 30.

In the 3D-net 30 illustrated in FIG. 4, since the distances S1 and S2 are less than the dimensional criterion S0, so chain 34 is added to connect the nodes A1 and A2 and chain 36 is added to connect the nodes A2 and A3. Since the distances S3, S4 and S5 are greater than the dimensional criterion S0, so there is no chain in pairs of A1-A4, A2-A4 and A3-A4.

Figure 5:
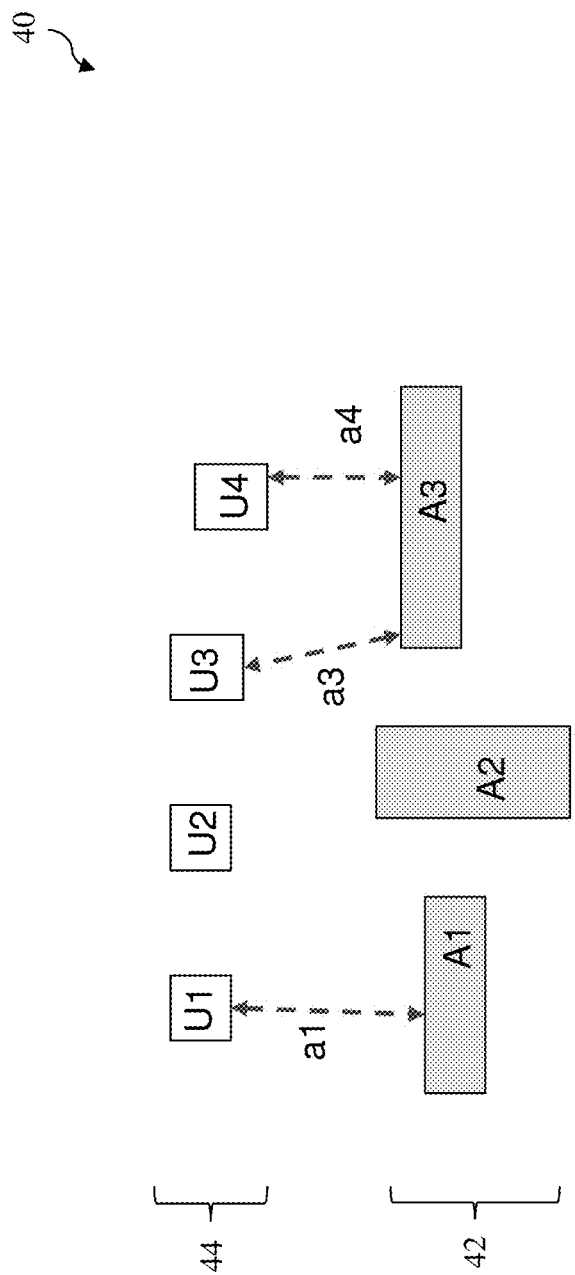
FIG. 5 illustrates a schematic view of an IC design layout having two layers constructed according to one or more embodiment.

FIG. 5 is a schematic view of an integrated circuit (IC) patterns (or design layout) 40 defined in two layers. Each layer includes a pattern having multiple features. In the present example, a first layer 42 is also referred to as layer "A" and the second layer 44 is also referred to as layer "U". In the semiconductor fabrication, the pattern defined in the first layer 42 is transferred to a first material layer on a wafer and the pattern defined in the second layer 44 is transferred to a second material layer on the wafer. In a particular example, the second material layer is disposed on the first material layer and the corresponding patterns are to be properly aligned to form a functional circuit with desired performance and reliability.

The first layer (or Layer "A") 42 includes exemplary features A1, A2 and A3. The second layer (or layer "U") 44 includes exemplary features U1, U2, U3 and U4. In the present case, both layers 42 and 44 are to be decomposed into two masks, respectively. For example, the pattern in the first layer 42 is decomposed to two sub-patterns defined in two masks MA1 and MA2, respectively. Similarly, the pattern in the second layer 44 is decomposed to two sub-patterns defined in two masks and MU1 and MU2, respectively.

According to some manufacturing concerns (such as alignment concerns), features in one layer is correlated with features in another layer. As one example illustrated FIG. 5, feature U1 has to be aligned to feature A1, and meanwhile both features U3 and U4 have to be aligned to A3. A correlation marker is used to denote such a correlation connection between features in different layers (such as U and A layers). In FIG. 5, those correlation markers are labeled as "a1", "a3" and "a4", respectively.

For one situation where features A1 and A3 are in the mask MA1 while feature A3 is in the mask MA2, then feature U1 must be defined in mask MU1 and features U3 and U4 must be defined in the mask MU2. For another situation where features A1 and A3 are in mask MA1, then features U1, U3 and U4 are required to be in a same mask MU1.

Figure 6:
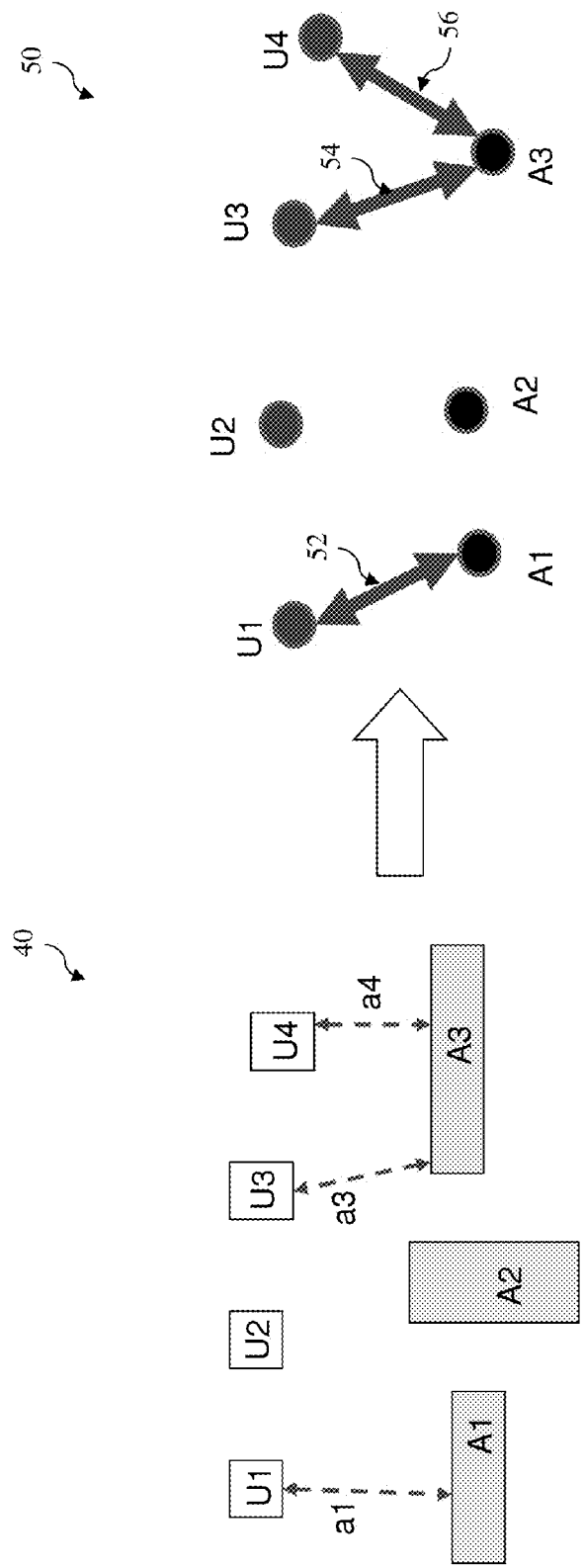
FIG. 6 illustrates a schematic view of an IC design layout and a topological diagram constructed according to one embodiment.

FIG. 6 includes the integrated circuit (IC) patterns 40 defined in two layers. The patterns 40 are converted into a topological diagram (or 3D-net) 50 to simplify an interlayer geometry relation for alignment conflict check. Two terms "node" and "arrow" are used in the 3D-net 50, where the node is defined before. In this example, the features A1-A3 an U1-U4 in the patterns 40 are represented by nodes A1-A3 an U1-U4 in the 3D-net 50.

A correlational marker in the patterns 40 is represented by an arrow in the 3D-net 50. The arrow links the corresponding nodes in different layers. For example, the correlational markers "a1", "a3" and "a4" are represented by arrows 52, 54 and 56, respectively. Thus, the 3D-net 50 carriers on all features and the correlational relations.

Collectively considering various terms are defined in FIGS. 4 and 6, a design layout having patterns defined in multiple layers can be converted into a topological diagram (or 3D-net) to represent various features and various relations, such as a dimensional relation for features in a same layer and a correlation relation for features in different layer). The topological diagram includes nodes, chain(s) and arrow(s) configured accordingly to the design layout.

Figure 7:
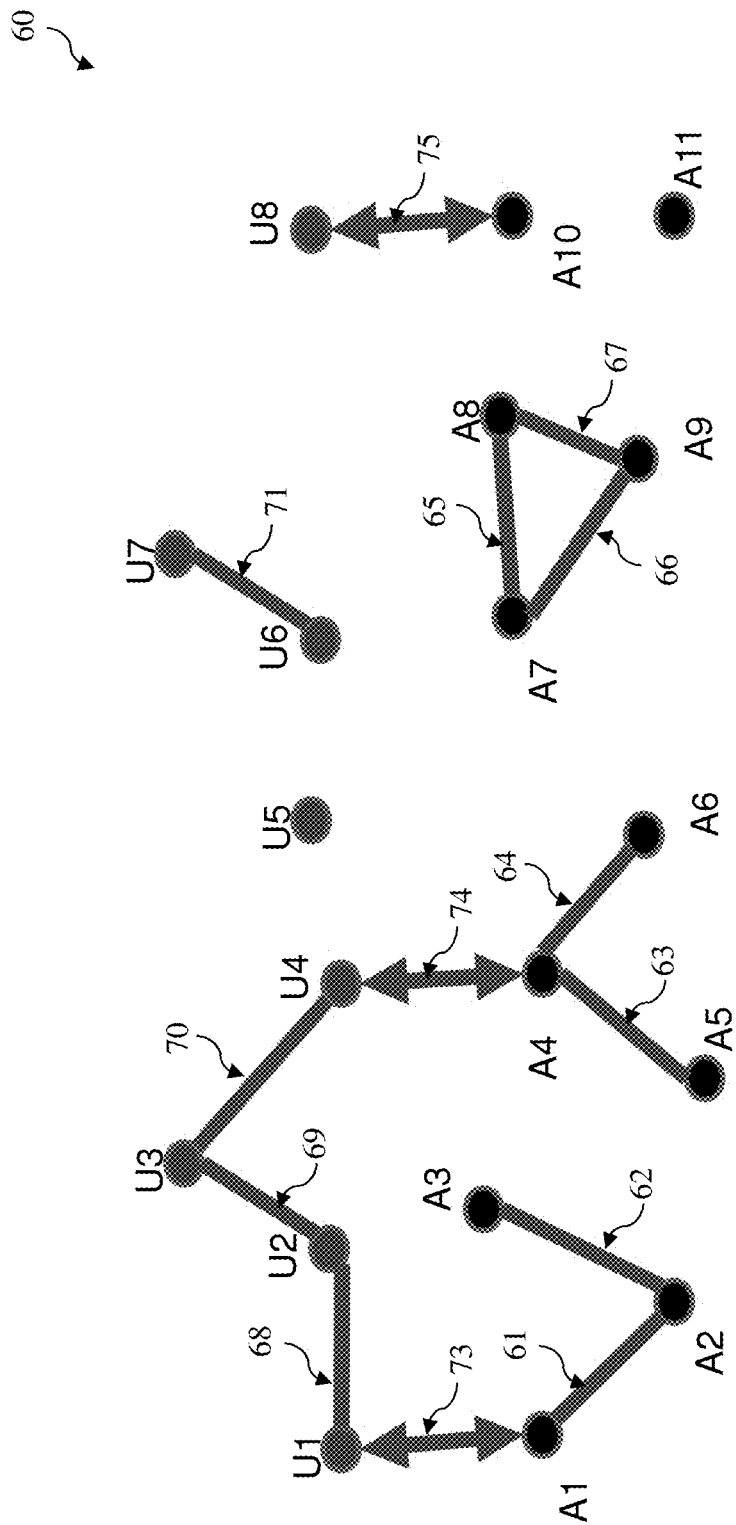
FIGS. 7, 8A and 8B illustrate various embodiments of a topological diagram.

FIG. 7 is an exemplary topological diagram 60 that includes nodes A1-A11 in the layer "A" and nodes U1-U8 in the layer "U". The topological diagram 60 also includes various chains defined between adjacent nodes in the same layer and arrows defined between nodes in different layers. For example, chains 61-67 are defined in the layer "A"; chains 68-71 are defined in the layer "U"; and arrows 73-75 are defined between the layers "A" and "U".

Each topological diagram includes "nodes and chains", "nodes and arrows", or "nodes, chains and arrows". Again, such a topological diagram is denoted as a 3D-net (or net). When a 3D-net includes a cycle defined by nodes, chains and arrows, the cycle is referred to as a "loop" (or 3D loop). For example, the nodes A7, A8 and A9 plus the chains 65, 66 and 67 form a loop.

Figure 8B:
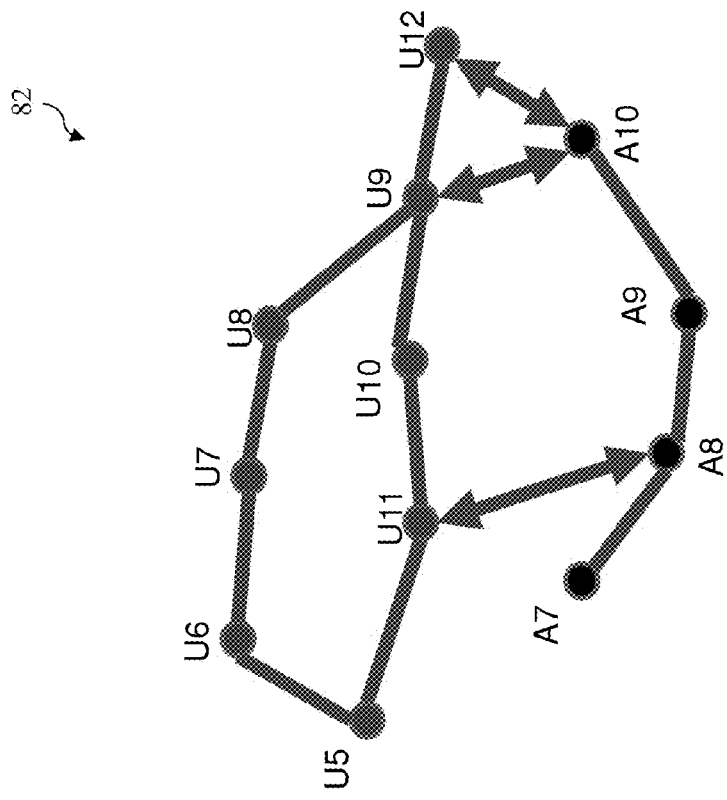
Figure 8A:
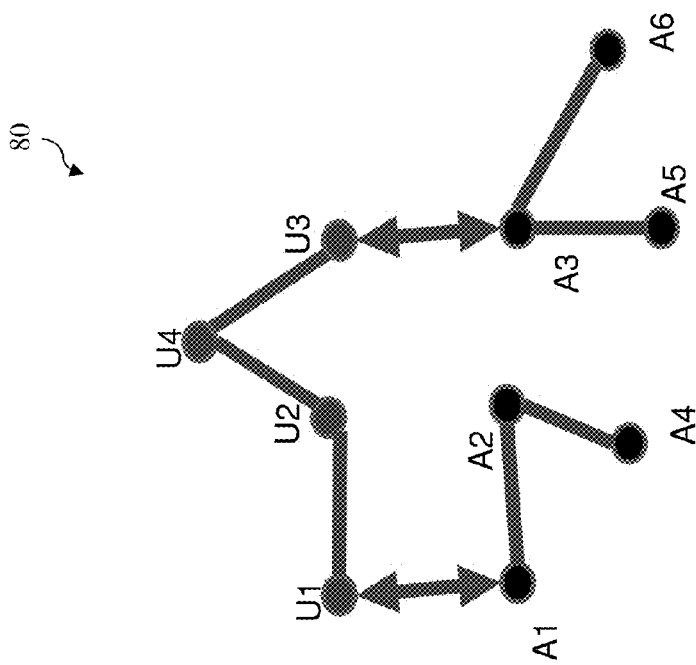

FIG. 8A is one example of a 3D-net 80 and FIG. 8B is another example of a 3D-net 82. In FIG. 8A, the 3D-net 80 includes nodes A1, A2, A3, A4, A5, A6, U1, U2, U3 and U4 defined in two layers "A" and "U". The 3D-net 80 is an open net since no loop is formed therein.

In FIG. 8B, the 3D-net 82 includes nodes A7-A10, U5-U12 defined in the two layers "A" and "U". The 3D-net 82 includes loops defined by nodes, chains and arrows. For examples, the nodes U5, U6, U7, U8, U9, U10 and U11 with corresponding chains form a loop within a single layer; the nodes A8, A9, A10, U9, U10 and U11 with corresponding chains and arrows form another loop in 2 layers; and the nodes A10, U9 and U12 with corresponding chain and arrows form another loop in 2 layers.

A parameter "path count" is further introduced as a characteristic parameter for a 3D-net. When there is a path to connect two nodes, a path count Cp is defined for the path between the two nodes. The number of chains in the path is referred to as Nc and the number arrows in the path is referred to as Na. A path count for the path between the two nodes is defined as a summation of the number of chains and the number arrows in the path between the two nodes, or formulated as Cp=Nc+Na.

In a particular case, a path count of a loop is the sum of Nc+Na in the loop path. In this case, Nc is the number of chains in the loop path and Na is the number of arrows in the loop path.

Various examples of path counts are provided with reference to FIGS. 8a and 8b. The path between the nodes A4 and A5 in the 3D-net 80 is A4-A2-A1-U1-U2-U4-U3-A3-A5, the corresponding path count between A4 and A5 is 8. The path count in the loop U5-U6-U7-U8-U9-U10-U11-U5 is 7. The path counts in the loop A8-A9-A10-U9-U10-U11-A8 is 6. The path counts in the loop A10-U12-U9-A10 is 3.

A set of rules applied to a 3D-net for conflict evaluation is referred to as net rules and is described below. Rule One: in a first situation where there is no loop in a 3D-net, all the features (corresponding to all nodes in the 3D-net) can be properly decomposed into two masks for each of the layers U and A, respectively. Thus decomposed features in the layer U can correctly align to the decomposed features in the layer A without alignment conflict.

Rule Two: in a second situation where there is a loop in a 3D-net and the path count of the loop is an even number, all features associated with nodes contained in this loop can be properly decomposed into two masks for each of the layers U and A, respectively. The decomposed features in the layer U can correctly align to the decomposed features in the layer A without conflict.

Rule Three: in a third situation where there is a loop in a 3D- net and the path count of the loop is an odd number, there is no proper decomposition without conflict. Particularly, there are three cases. If the loop is purely in the layer U, then the features contained in the loop in the layer U cannot be properly decomposed without conflict. If the loop is purely in the layer A, then the features contained in the loop in the layer A cannot be properly decomposed without conflict. If the loop is formed by both layers A and U, then the decomposed features in the loop cannot be aligned without conflict.

Rule Four: in a fourth situation wherein the layer U is defined in a single mask and the corresponding features in the layer U is formed by a single mask process, then there is no loop formed by both layers U and A. In this case, if the 3D-net is formed in both layers U and A, and the path count between two nodes in the layer U is even, the corresponding two features in the layer U can be properly aligned to the corresponding features in the layer A without conflict.

By applying the Rule one to Rule Four to nodes in the 3D-net, various conflicts can be effectively identified. The above net rules and the applications thereof are further described with a reference to FIG. 9 having a flowchart of a method 90 for conflict check to a 3D-net. The method 90 is applicable to a design layout that has two or more layers and is represented in a 3D-net. In the present embodiment, a design layout defined in two layers U and A is used as an example for illustration. The layer U is disposed on the layer A when both layers are formed in an integrated circuit wafer. First, check if the layer U is formed by a single mask process (so no decomposition of the features in the layer U but all features of the layer U are defined in a single mask), as shown in block 92. If yes to block 92, the method 90 proceeds to block 94 by applying the Rule Four for conflict check. If no to block 92, the method 90 proceeds to block 96 to check if there is a loop in the 3D-net. If no to block 96, then the Rule One is applied for conflict check, as shown block 98. If yes to block 96, the method 90 proceeds to block 100 to evaluate the path count of the loop. If the path count of the loop is even (an even number), then the Rule Two is applied as shown in block 102. If the path count of the loop is odd (an odd number), then the Rule Three is applied as shown in block 104.

Figure 10:
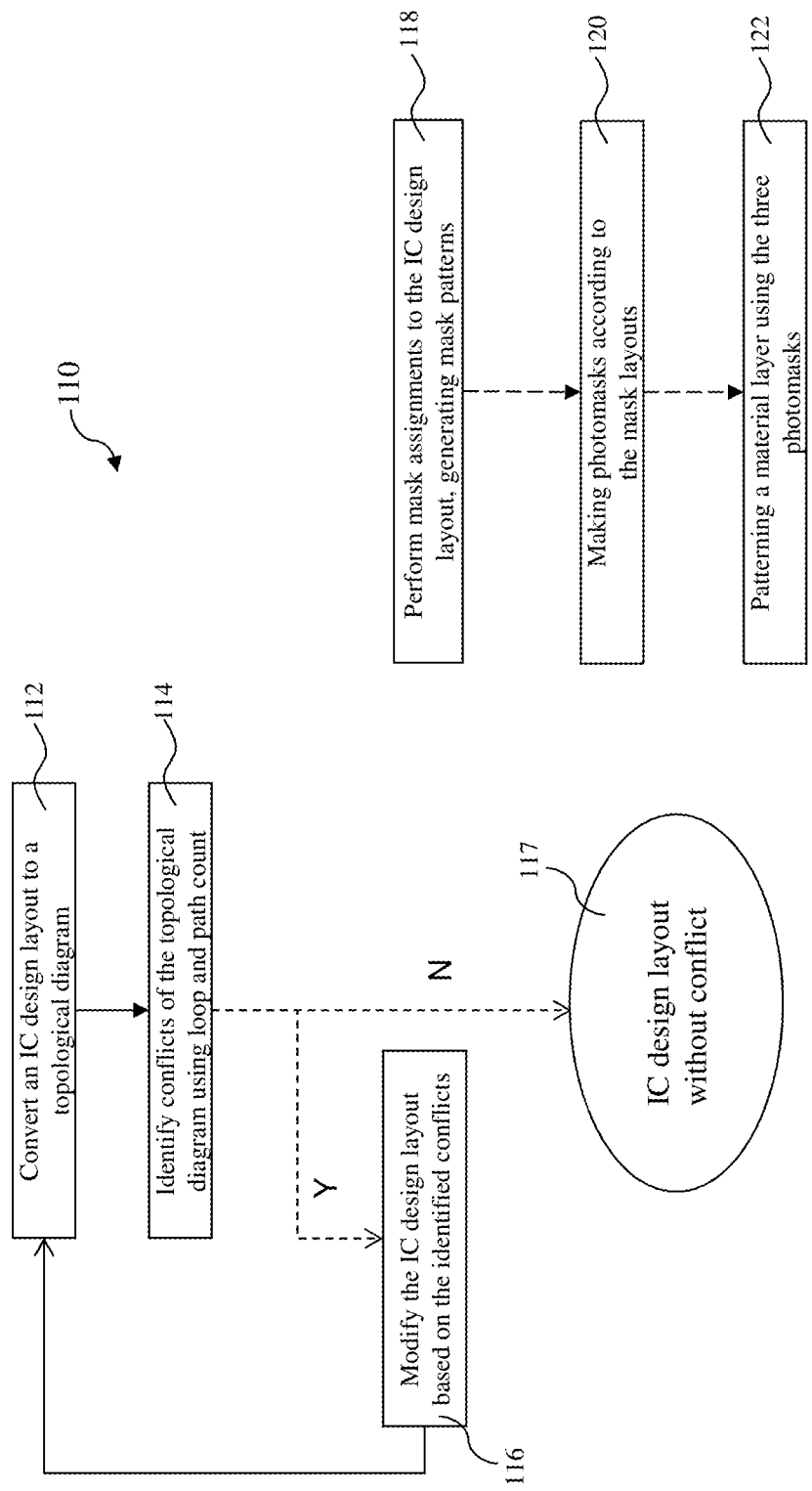
FIG. 10 is a flowchart of another embodiment of a method for IC design constructed according to aspects of the present disclosure.

FIG. 10 is a flowchart for a method 110 to check conflict associated with mask alignment in a design layout constructed according to aspects of the present disclosure in one embodiment. The definitions of the previously introduced terms are not repeated here for simplicity. The method 110 begins with an operation 112 by converting a design layout into a topological diagram (or 3D-net) based on alignment related restrictions. In the present embodiment, the IC design layout includes two patterns defined in two layers, respectively. Each layer includes a pattern having a plurality of features (polygons). The two patterns are to be properly aligned when formed in an IC substrate. Double patterning technologies (DPT) are implemented to at least one layer. Alternatively, multiple patterning technologies may be implemented. When a pattern is decomposed to different masks, there might be some conflicts for mask alignments between various masks associated with the two layers.

The design layout is converted to a 3D-net that includes nodes, chains and arrows based on mask related restrictions. Particularly, each feature in the design layout is converted to a node in the 3D-net. In consideration of mask alignment, a chain is introduced for an assignment relation of features in a same layer and an arrow is introduced for assignment relation of features in different layers. Specifically, a chain represents a mask assignment relation between two features in a same layer. When two features in the same layer are required to be assigned to different masks due to the manufacturing limit, such as the distance being too small beyond the fabrication capability, a chain is present to link the two nodes that correspond to the two features. An arrow represents a mask assignment relation between two features in two different layers. When two features in the different layers are required to be aligned with each other, an arrow is present to link the two nodes that correspond to the two features in the two different layers. Such converted 3D-net is a topological diagram having nodes, chains and arrows. In other words, length or direction of a chain or an arrow is not a relevant factor for the following operations in the method 110. Several examples of a 3D-net are provided in FIGS. 7, 8a and 8b.

Figure 9:
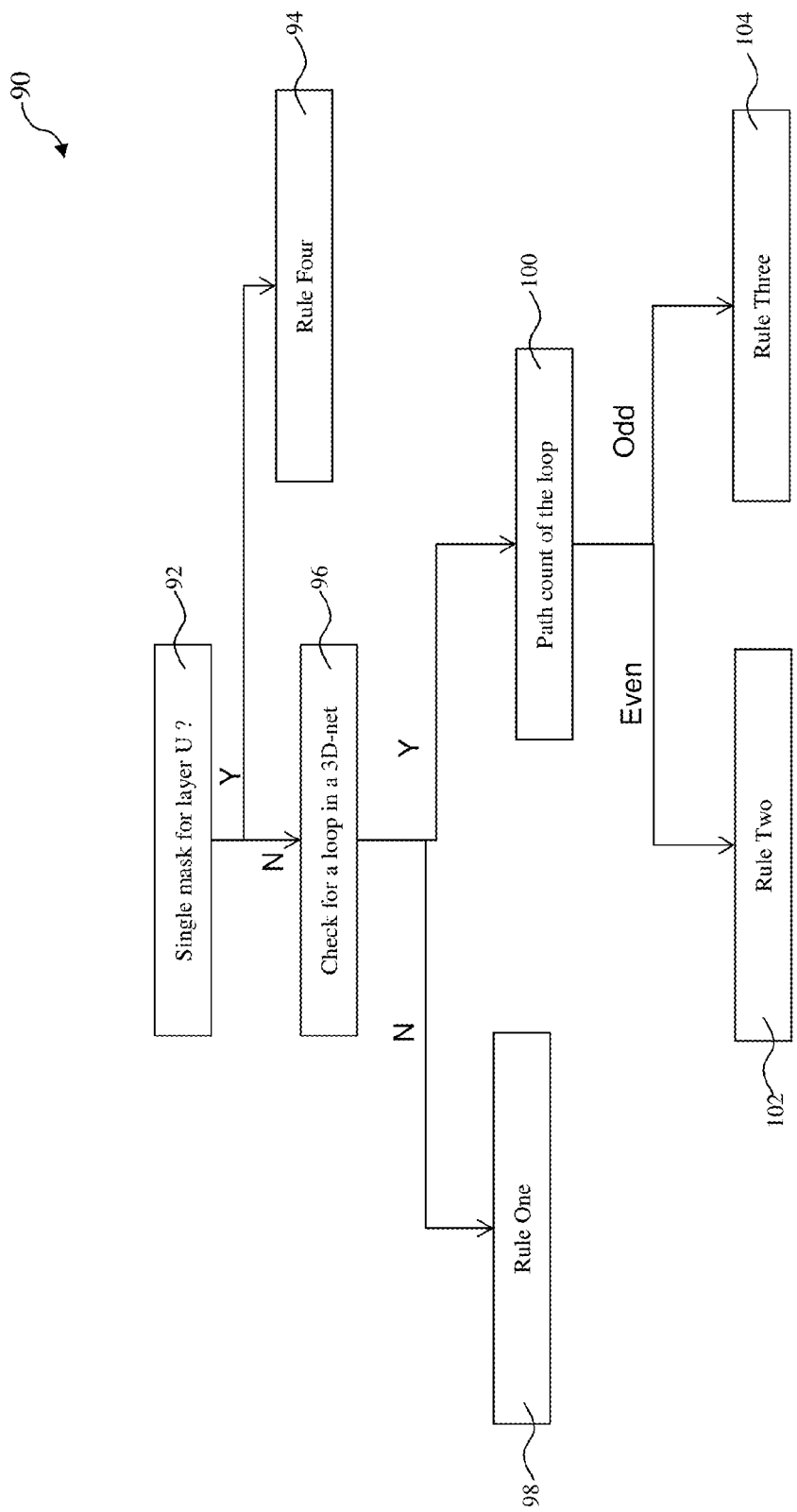
FIG. 9 is a flowchart of an embodiment of an IC design method constructed according to aspects of the present disclosure.

The method 110 proceeds to operation 114 by identifying conflicts in the 3D-net using loop and path count of the 3D-net. Particularly, the method 90 of FIG. 9 is implemented to identify any conflict. In one embodiment, the method 90 may first be applied to at least a portion of the 3D-net and consume to other portions until the nodes of the 3D-net are exhausted.

The method 110 may proceed to operation 116 by modifying the IC design layout based on the conflicts (if any) identified at operation 114. In one embodiment, when a conflict is identified in a portion of the 3D-net, at least the corresponding portion of the design layout is modified (redesigned) such that the conflict is eliminated in the modified design layout. For example, a conflict is identified in a loop of the 3D-net, the corresponding features associated with the loop are modified to break the loop. In various examples, the modification to the design layout includes adjusting size of a feature, changing shape of a feature, and/or tuning spacing between adjacent features. In another embodiment, the method 110 includes an iteration procedure that the operations 112 and 114 are applied to the modified design layout to further check conflict until there is no any conflict in the 3D-net associated, ending up with an IC design layout 117 without mask alignment conflict.

Other process steps may be implemented before, during and after the operations in the method 110. In one embodiment, the method 110 may be followed with an operation 118 by performing mask assignments to the IC design layout 117, generating mask patterns for mask making. Especially, the pattern defined in each layer (or at least one layer) is decomposed into two masks. During mask assignments, the features in each layer are assigned to two masks according various rules, such as manufacturing capability and alignment requirement.

After the operation 118, followed may be another operation 120 by making masks according to the mask patterns. In one embodiment, an e-beam or a mechanism of multiple e-beams is used to form a mask pattern on a mask.

An operation 122 may be subsequently implemented to pattern respective material layers using the masks. Particularly, the pattern defined in one layer of the design layout is formed on one material layer of an IC substrate by a lithography process using two masks. The pattern defined in another layer of the design layout is formed on another material layer of the IC substrate by a lithography process using two masks (or alternatively using a single mask). Since alignment conflict is eliminated in the design layout, various alignments associated with lithography processes can be properly implemented without conflict. In one example, each material layer is a hard mask layer. The substrate or an underlying material is etched using the hard mask layer as an etch mask so that the IC features defined in the hard mask layer is transferred to the IC substrate or the underlying material layer.

Figure 11:
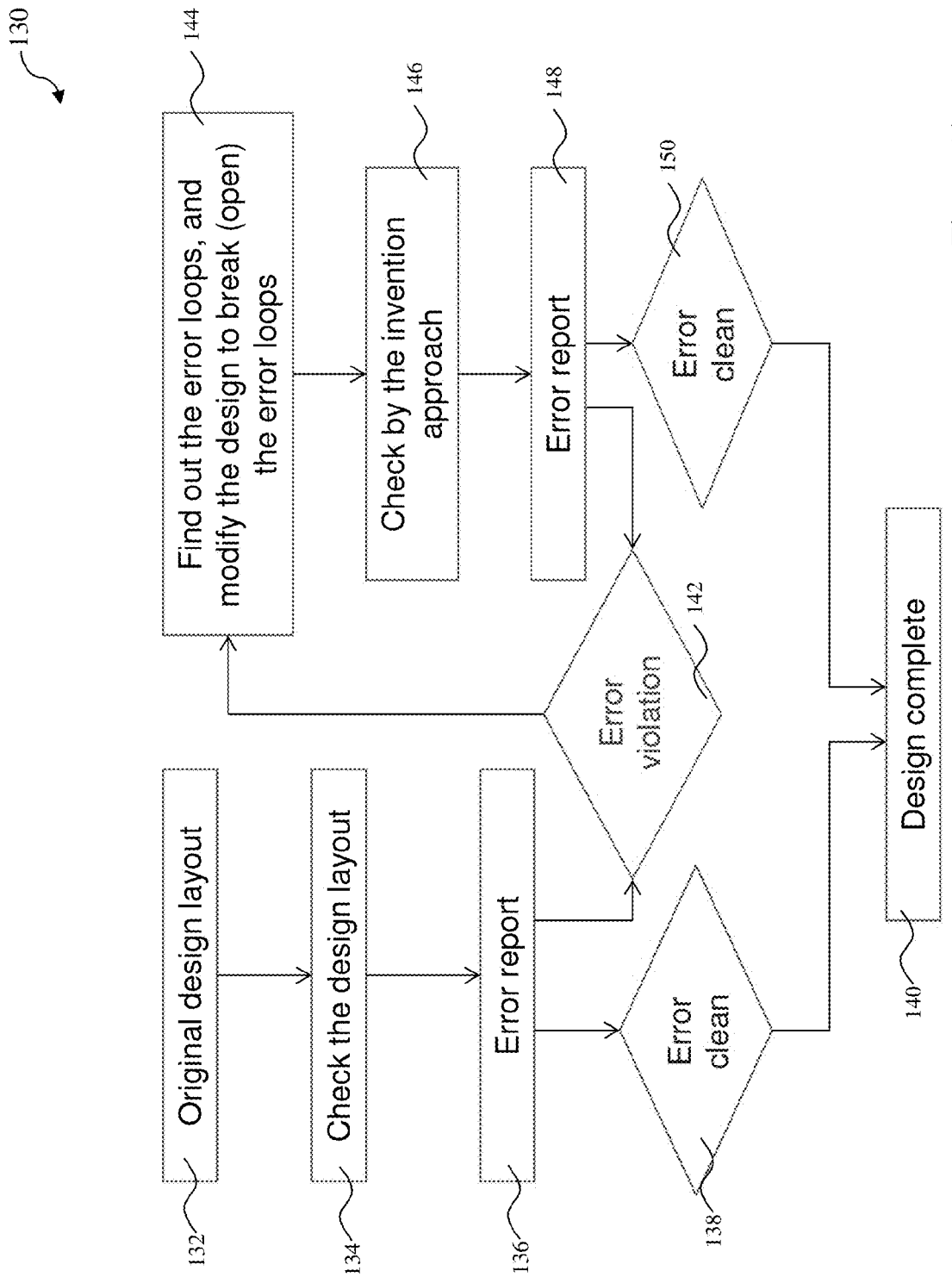
FIG. 11 is a flowchart of another embodiment of an IC design method constructed according to aspects of the present disclosure.

FIG. 11 is a flowchart for a method 130 for IC design procedure including design check and error fixing, constructed according to aspects of the present disclosure in one embodiment. The method 130 includes receiving an (original) design layout at block 132. The method proceeds to block 134 for checking the design layout by the method 110. Particularly, the operation to check the design layout is implemented by the operations 112 and 114 in the method 110. At block 134, an error report is generated according to the design layout checking. The error report may include one or more identified conflict. In block 138, if the error report is clean and no conflict is identified, the design is completed (block 140). A tape-out is generated according to the design layout for mask making.

Illustrated in block 142, when an error (conflict or violation) is identified in the error report, the method 130 proceeds to next operation in block 144. At block 144, the error loops are found according to the error report and are modified to break (open) the error loops. The method 130 proceeds to operation 146 to check the modified design layout for any error. Another error report is generated for the modified design layout at block 148. If there is any error identified in the error report (block 142), the method 130 proceeds to operation 144 for further conflict check. If no error is identified in the error report (block 150), the design is competed shown in block 140.

FIGS. 12A, 12B and 12C provide an example of gating the design error (conflict) associated with mask alignment requirement. In FIG. 12A, an IC design layout 160 includes two layers: a metal layer and a via layer over the metal layer. Specifically, the design layout includes a first layer M1 and a second layer VIA 1. The M1 layer includes 3 exemplary features (M-a, M0b and M-c) and the VIA1 layer includes 6 via features: three VIA1 features (VIA-a, VIA-b and VIA-c) being critical in the mask alignments and associated with alignment requirements and other threes being not.

As illustrated in FIG. 12B, the design layout is converted into a topological diagram (3D-net) by the operation 112 of the method 110. The 3D-net includes nodes, chains and arrows.

As illustrated in FIG. 12C, various conflicted are identified by the operation 114 of the method 110. There are two conflicts (failures) are identified. First conflict: VIA-a and VIA-c are in a same VIA mask but are aligned to different M1 masks. Second conflict: VIA-b and VIA-c are in different VIA masks but are aligned to the same M1 mask.

FIGS. 13A, 13B and 13C provide an example of modifying the design layout 160 to fix the design error (conflict). In FIG. 13A, an IC design layout 162 is generated by modifying the design layout 160 using the operation 116 of the method 110. Particularly, the distance (spacing) between the M-b and M-c is increased to be greater than the decomposition criterion.

In FIG. 13B, a topological diagram or 3D-net is generated from the design layout 162. The 3D-net in FIG. 13B is different from the 3D-net in FIG. 12B. In the 3D-net of FIG. 12B, there is no chain between the nodes corresponding to the features M-b and M-c.

As illustrated in FIG. 13C, the operation 114 of the method 110 is applied to the 3D-net of FIG. 13B for conflict check. The modified design layout 162 meets the alignment requirement without conflict. VIA-a and VIA-c are in a same VIA mask, and are aligned to a same M1 mask. VIA-b and VIA-c are in different VIA masks and are aligned to respective M1 masks.

Other embodiments and modifications may be implemented without departing from the spirit of the present disclosure. In one embodiment, instead of the hard mask layer, a metal layer or a dielectric material layer may be directly patterned to form various IC features using the masks. In another embodiment, thus patterned hard mask may be used to form various doped features. In yet another embodiment, the disclosed method may be used to form IC features such as shallow trench isolation (STI) features or gate stacks. In yet another embodiment, the photolithography process may utilize a suitable light source, such as ultraviolet (UV), deep UV (DUV), or extreme UV (EUV). In yet another embodiment, the method is applicable to multiple patterning technologies to eliminate conflicts associated with mask alignments.

The disclosed method in various embodiments provides an algorithm to be implemented in a computer system. For example, the method 90 provides an algorithm for check mask alignment conflict in an IC design layer having at least two layers. In another example, the operations 112 and 114 in the method 110 provide an algorithm for converting a design layout into a topological diagram and identifying a conflict in the topological diagram according to various rules described in the method 110. In another example, the operations 112, 114 and 116 provide another algorithm to be implemented in a computer system. In yet another example, the operations 112, 114, 116 and 118 provide another algorithm to be implemented in a computer system. In yet another example, the flowchart 130 provides another algorithm to be implemented in a computer system. In one embodiment, the disclosed algorithm is incorporated in the design rule and is programmed in a design rule check (DRC) utility.

In yet another embodiment, the design tool (system) a design for manufacturing (DFM) package. The DFM package includes a DRC module to check a design layout for various violation, conflict and error. The DFM package includes a simulation module that further includes various simulation models to simulate respective semiconductor processes utilized to form an integrated circuit on a wafer based on the design layout. The DFM package may further include a DFM data kit having various manufacturing data used by the simulation module for fabrication simulation specific to a semiconductor fabrication associated with the semiconductor data. The disclosed algorithm is integrated in the DRC module to check and eliminate any alignment conflict associated with DPT or multiple patterning technologies.

Various advantages may present in the disclosed method and the design system in various embodiments. In one embodiment, the disclosed method is able to optimize layer to layer alignment condition between decomposed masks in a DTP process. In another embodiment, the disclosed method is implemented in a computer system (such as a design tool) without direct engineer involvement and delivers a design layout free of alignment conflict. Accordingly, the back and forth communication between the designer and mask manufacturer is eliminated and the design cycle time is shorten.

Thus, the present disclosure provides an integrated circuit (IC) design method. The method includes receiving an IC design layout having a first plurality of features defined in a first layer and a second plurality of features defined in a second layer; converting the IC design layout to a topological diagram having nodes, chains and arrows; and identifying alignment conflict based on the topological diagram using rules associated with loop and path count.

The present disclosure also provides another embodiment of an integrated circuit (IC) design method. The method includes converting an IC design layout to a topological diagram having nodes, chains and arrows. The IC design layout includes a first plurality of features defined in a first layer and a second plurality of features defined in a second layer. The method further includes identifying alignment conflict of the IC design layout based on the topological diagram.

The present disclosure also provides one embodiment of an integrated circuit (IC) design tool. The IC design tool includes an IC design module that is operable to check mask alignment conflict to an IC design layout. The IC design layout includes a first plurality of features defined in a first layer and a second plurality of features defined in a second layer. The IC design module is operable to convert the IC design layout to a topological diagram having nodes, chains and arrows; identify alignment conflict based on the topological diagram using rules associated with loop and path count; and modify the IC design layout based on identified alignment conflict.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
receiving an integrated circuit (IC) design layout having a first plurality of features defined in a first layer and a second plurality of features defined in a second layer, wherein the first layer corresponds to a first material layer, and wherein the second layer corresponds to a second material layer;
converting, by a computer system, the IC design layout to a topological diagram having nodes, chains and arrows; and
identifying alignment conflict based on the topological diagram using rules associated with loop and path count, wherein in the topological diagram an arrow represents a mask alignment relation between two features in the first and second layers, respectively, and links the two features.

2. The method of claim 1, further comprising modifying the IC design layout according to identified alignment conflict, resulting in a modified IC design layout.

3. The method of claim 2, wherein the modifying of the IC design layout includes at least one of adjusting size of a feature, changing shape of the feature, and tuning spacing between two adjacent features.

4. The method of claim 2, further comprising
converting the modified IC design layout to a new topological diagram; and
identifying alignment conflict based on the new topological diagram.

5. The method of claim 4, further comprising
performing a mask assignment to the modified IC design layout when no alignment conflict is identified in the new topological diagram, generating mask patterns for mask making.

6. The method of claim 5, further comprising making masks according to the mask patterns.

7. The method of claim 6, further comprising fabricating a semiconductor wafer using the masks by a double patterning technology.

8. The method of claim 1, wherein in the topological diagram
a node represents a feature in the IC design layout;
a chain represents a mask alignment relation between second two features in one of the first and second layers and links the second two features.

9. The method of claim 1, wherein
a loop is a cycle path defined in the topological diagram and includes a subset of the nodes, the chains and the arrows in the topological diagram; and
a path count of the loop is a summation of a number of chains and a number of arrows in the loop.

10. The method of claim 1, wherein the rules includes a first rule, wherein the first rule predicts that there is no alignment conflict for features corresponding to nodes in the loop when there is no loop in the topological diagram.

11. The method of claim 1, wherein the rules includes a second rule, wherein the second rule predicts that there is no alignment conflict for features corresponding to nodes in the loop when there is a loop in the topological diagram and a path count of the loop is even.

12. The method of claim 1, wherein the rules includes a third rule, wherein the third rule predicts that there is an alignment conflict for features corresponding to nodes in the loop when there is a loop in the topological diagram and a path count of the loop is odd.

13. The method of claim 1, wherein the rules includes a fourth rule, wherein the fourth rule predicts that there is no alignment conflict for two features corresponding to the two nodes when the second layer is associated with a single mask process and a path count between two nodes of the second layer is even.

14. An integrated circuit (IC) design method comprising:
converting, by a computer system, an IC design layout to a topological diagram having nodes, chains and arrows, wherein the IC design layout includes a first plurality of features defined in a first layer and a second plurality of features defined in a second layer, wherein the first layer corresponds to a first material layer, wherein the second layer corresponds to a second material layer, and wherein in the topological diagram an arrow represents a mask alignment relation between two features in the first and second layers, respectively, and links the two features; and
identifying alignment conflict of the IC design layout based on the topological diagram.

15. The method of claim 14, further comprising modifying the IC design layout according to an identified alignment conflict.

16. The method of claim 15, further comprising
performing a mask assignment to a modified IC design layout, generating mask patterns for mask making; and
making masks according to the mask patterns.

17. The method of claim 14, wherein the rules include a first rule and a second rule, wherein
the first rule predicts that there is no alignment conflict for features corresponding to nodes in the loop when there is no loop in the topological diagram; and
the second rule predicts that there is no alignment conflict for features corresponding to nodes in the loop when there is a loop in the topological diagram and a path count of the loop is even.

18. The method of claim 14, wherein the rules includes a third rule, wherein the third rule predicts that there is an alignment conflict for features corresponding to nodes in the loop when there is a loop in the topological diagram and a path count of the loop is odd.

19. The method of claim 14, wherein the rules includes a fourth rule, wherein the fourth rule predicts that there is no alignment conflict for two features corresponding to the two nodes when the second layer is associated with a single mask process and a path count between two nodes of the second layer is even.

20. An integrated circuit (IC) design apparatus, comprising an IC design module that is operable to check mask alignment conflict to an IC design layout, wherein the IC design layout includes a first plurality of features defined in a first layer and a second plurality of features defined in a second layer, wherein the first layer corresponds to a first material layer, wherein the second layer corresponds to a second material layer, and wherein the IC design module is operable to
convert the IC design layout to a topological diagram having nodes, chains and arrows, wherein in the topological diagram an arrow represents a mask alignment relation between two features in the first and second layers, respectively, and links the two features;
identify alignment conflict based on the topological diagram using rules associated with loop and path count; and
modify the IC design layout based on identified alignment conflict.

* * * * *